(12) United States Patent
Shin et al.

(10) Patent No.: US 11,587,897 B2
(45) Date of Patent: Feb. 21, 2023

(54) SEMICONDUCTOR DEVICE

(71) Applicant: Samsung Electronics Co., Ltd., Suwon-si (KR)

(72) Inventors: Joongwon Shin, Suwon-si (KR); Yeonjin Lee, Suwon-si (KR); Inyoung Lee, Yongin-si (KR); Jimin Choi, Seoul (KR); Jung-Hoon Han, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/143,224

(22) Filed: Jan. 7, 2021

(65) Prior Publication Data
US 2021/0305188 A1    Sep. 30, 2021

(30) Foreign Application Priority Data

Mar. 27, 2020 (KR) .................. 10-2020-0037698
Jun. 30, 2020 (KR) .................. 10-2020-0080050

(51) Int. Cl.
*H01L 23/29* (2006.01)
*H01L 23/31* (2006.01)
*H01L 23/00* (2006.01)

(52) U.S. Cl.
CPC ............ *H01L 24/13* (2013.01); *H01L 23/291* (2013.01); *H01L 23/293* (2013.01); *H01L 23/3171* (2013.01); *H01L 23/3192* (2013.01); *H01L 24/05* (2013.01); *H01L 2224/0401* (2013.01); *H01L 2224/13016* (2013.01); *H01L 2224/13021* (2013.01); *H01L 2224/13025* (2013.01); *H01L 2924/186* (2013.01)

(58) Field of Classification Search
CPC ..................................................... H01L 24/13
See application file for complete search history.

(56) References Cited

U.S. PATENT DOCUMENTS 9,373,598 B2    6/2016  Tu et al.
9,773,732 B2    9/2017  Chen et al.
(Continued)

FOREIGN PATENT DOCUMENTS

| KR | 10-1249555 B1 | 4/2013 |
| TW | 201903991 A | 1/2019 |
| TW | 202002172 A | 1/2020 |

OTHER PUBLICATIONS

US 10,586,747 B2, 03/2020, Costa et al. (withdrawn)

*Primary Examiner* — William A Harriston
(74) *Attorney, Agent, or Firm* — Muir Patent Law, PLLC

(57) ABSTRACT

Disclosed is a semiconductor device comprising a semiconductor substrate, a conductive pad on a first surface of the semiconductor substrate, a passivation layer on the first surface of the semiconductor substrate, the passivation layer having a first opening that exposes the conductive pad, an organic dielectric layer on the passivation layer, the organic dielectric layer having a second opening, and a bump structure on the conductive pad and in the first and second openings. The organic dielectric layer includes a material different from a material of the passivation layer. The second opening is spatially connected to the first opening and exposes a portion of the passivation layer. The bump structure includes a pillar pattern in contact with the passivation layer and the organic dielectric layer.

20 Claims, 10 Drawing Sheets

(56) References Cited

U.S. PATENT DOCUMENTS

| | | | |
|---|---|---|---|
| 9,922,915 | B2 | 3/2018 | Pendse |
| 10,325,869 | B2 | 6/2019 | Choi et al. |
| 10,483,224 | B2 | 11/2019 | Jin et al. |
| 2014/0252608 | A1* | 9/2014 | Chen .................. H01L 23/5329 257/773 |
| 2019/0013254 | A1 | 1/2019 | Costa et al. |
| 2019/0259718 | A1 | 8/2019 | Choi et al. |
| 2019/0385962 | A1 | 12/2019 | Ranmuthu et al. |
| 2020/0013745 | A1 | 1/2020 | Lee et al. |

* cited by examiner

SEMICONDUCTOR DEVICE

CROSS-REFERENCE TO RELATED APPLICATIONS

This U.S. nonprovisional application claims priority under 35 U.S.C. § 119 to Korean Patent Application Nos. 10-2020-0037698 filed on Mar. 27, 2020 and 10-2020-0080050 filed on Jun. 30, 2020 in the Korean Intellectual Property Office, the disclosures of which are hereby incorporated by reference in their entirety.

BACKGROUND

The present inventive concepts relate to a semiconductor device, and more particularly, to a semiconductor device including a bump structure.

Semiconductor devices have been rapidly developed to increase the number of electrode terminals and to decrease a pitch between the electrode terminals. Along with this, research has been increasingly conducted into reducing sizes of semiconductor devices. Semiconductor devices generally have electrical connection terminals, such as solder balls or bumps, for electrical connections with other electronic devices or printed circuit boards. Semiconductor devices benefit from having highly reliable connection terminals.

SUMMARY

Some example embodiments of the present inventive concepts provide a semiconductor device with increased durability and reliability.

According to some example embodiments of the present inventive concepts, a semiconductor device may comprise: a semiconductor substrate; a conductive pad on a first surface of the semiconductor substrate; a passivation layer on the first surface of the semiconductor substrate, the passivation layer having a first opening that exposes a portion of the conductive pad; an organic dielectric layer on the passivation layer, the organic dielectric layer having a second opening; and a bump structure on the conductive pad and in the first and second openings. The organic dielectric layer may include a material different from a material of the passivation layer. The second opening may be spatially connected to the first opening and may expose a portion of the passivation layer. The bump structure may include a pillar pattern in contact with the passivation layer and the organic dielectric layer.

According to some example embodiments of the present inventive concepts, a semiconductor device may comprise: a semiconductor substrate; a conductive pad on a first surface of the semiconductor substrate; a silicon-containing layer on the first surface of the semiconductor substrate and exposing a portion of the conductive pad; a polymer layer on the silicon-containing layer and exposing a portion of the silicon-containing layer and the portion of the conductive pad; a pillar pattern on the conductive pad and in contact with the silicon-containing layer and the polymer layer; and a solder pattern on the pillar pattern.

According to some example embodiments of the present inventive concepts, a semiconductor device may comprise: a semiconductor substrate; a circuit layer on the semiconductor substrate; a conductive pad on the circuit layer; a silicon-containing layer on the conductive pad, the silicon-containing layer having a first opening; a polymer layer on the silicon-containing layer, the polymer layer having a second opening; and a bump structure disposed on the conductive pad. The circuit layer may include: an integrated circuit on a first surface of the semiconductor substrate; a dielectric layer on the first surface of the semiconductor substrate, the dielectric layer covering the integrated circuit; and an interconnection structure in the dielectric layer, the interconnection structure coupled to the integrated circuit, the interconnection structure including a wiring pattern and a via pattern. The first opening may expose a portion of the conductive pad and an inner wall of the silicon-containing layer. The second opening may be spatially connected to the first opening and may expose a top surface of the silicon-containing layer. The bump structure may include: a pillar pattern in the first and second openings and in contact with the conductive pad, the inner wall and the exposed top surface of the silicon-containing layer, and an inner wall and a top surface of the polymer layer; and a solder pattern on the pillar pattern. The pillar pattern may include: a seed pattern in contact with the conductive pad; and a conductive pattern on the seed pattern.

DETAILED DESCRIPTION OF EMBODIMENTS

Figure 1A:
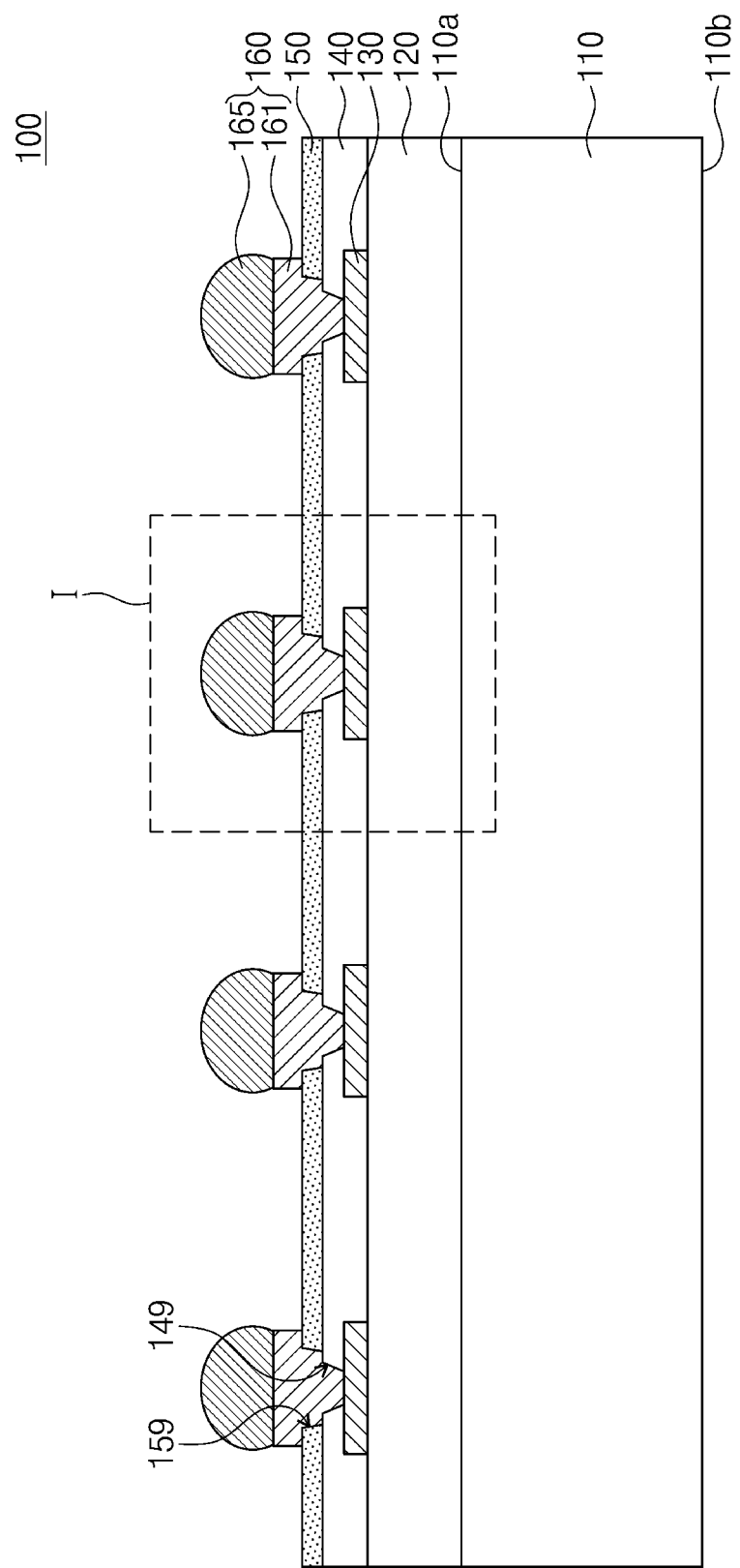
FIG. 1A illustrates a cross-sectional view showing a semiconductor device according to some example embodiments.

In this description, like reference numerals may indicate like components.

The following will now describe a semiconductor device and a method of fabricating the same according to the present inventive concepts.

Figure 1B:
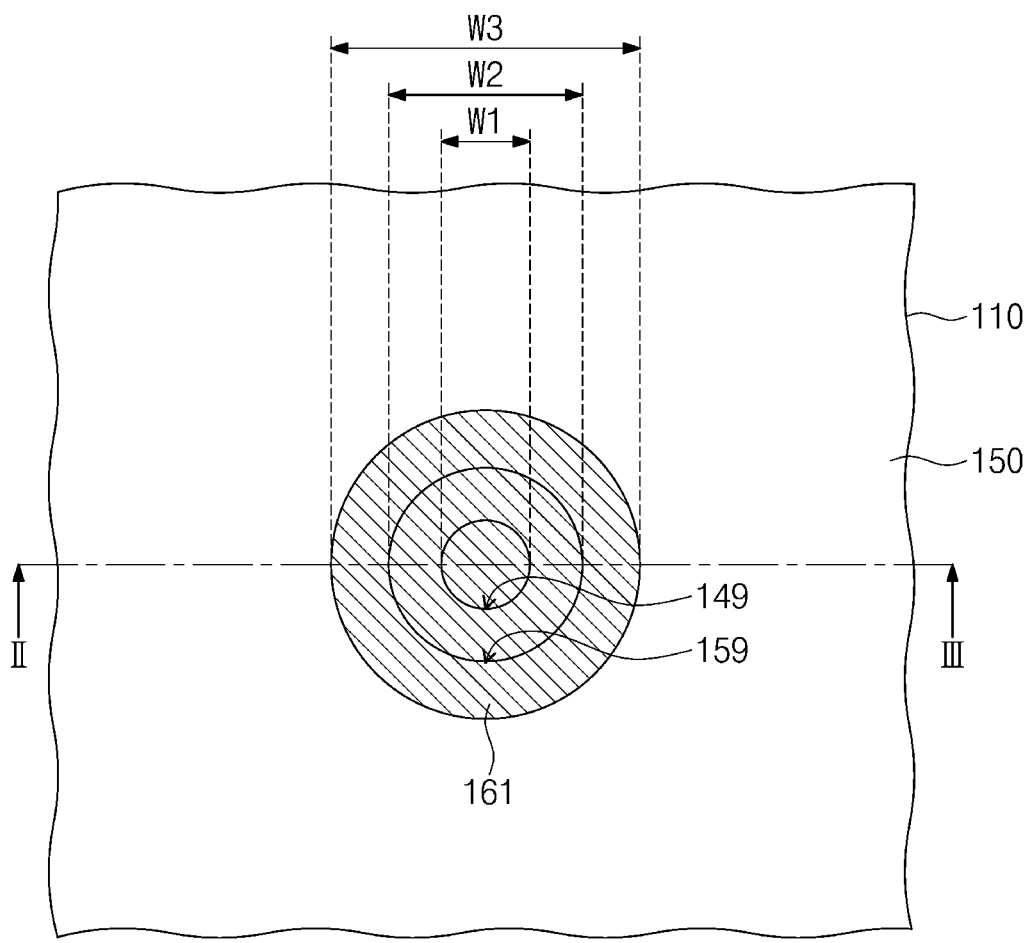
FIG. 1B illustrates a plan view showing a pillar pattern included in a semiconductor device according to some example embodiments.
Figure 1C:
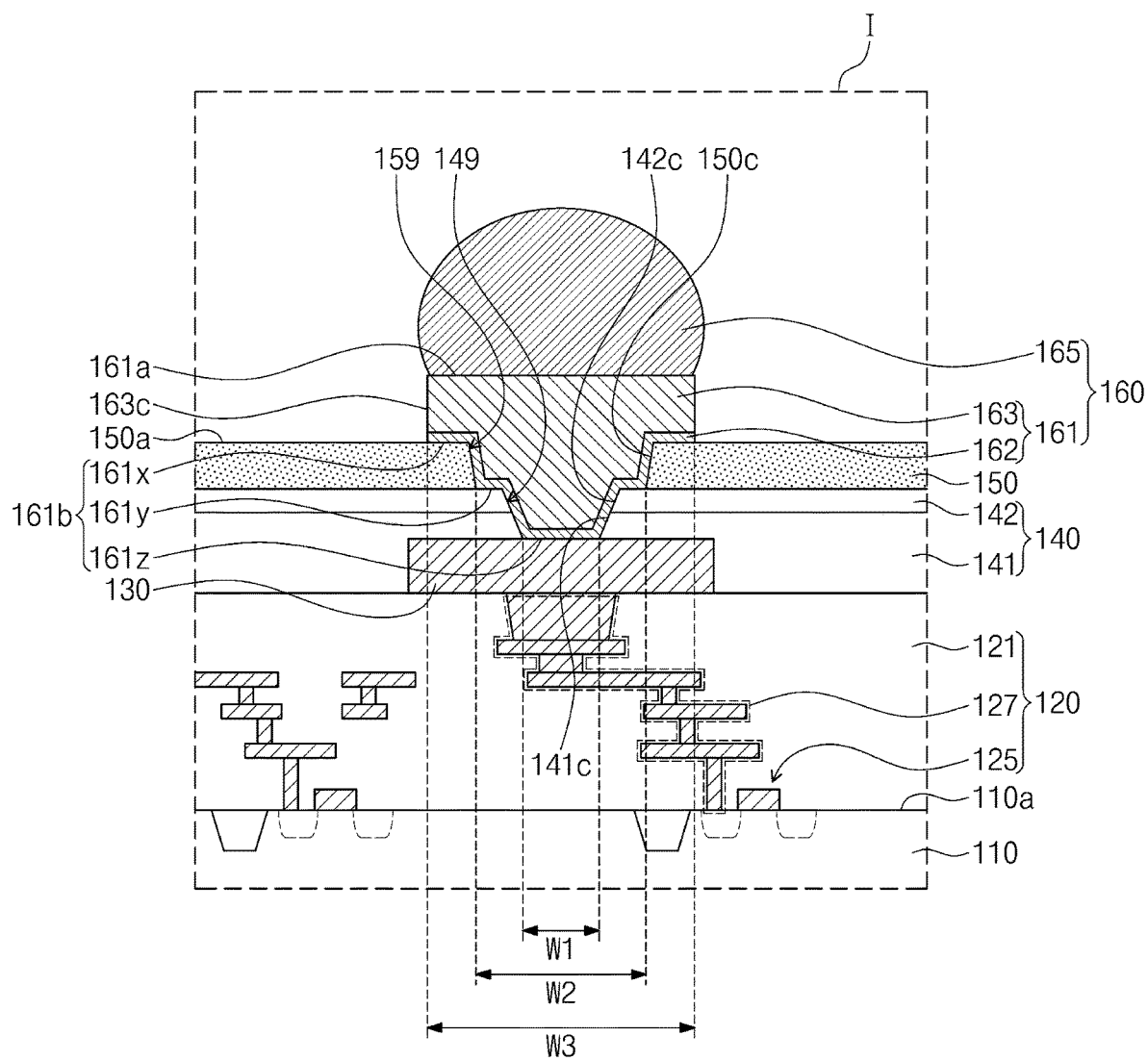
FIG. 1C illustrates an enlarged cross-sectional view taken along line II-III of FIG. 1B, corresponding to section I of FIG. 1A.

FIG. 1A illustrates a cross-sectional view showing a semiconductor device according to some example embodiments. FIG. 1B illustrates a plan view showing a pillar pattern included in a semiconductor device according to some example embodiments. FIG. 1C illustrates an enlarged cross-sectional view taken along line II-III of FIG. 1B, corresponding to section I of FIG. 1A.

Referring to FIGS. 1A, 1B, and 1C, a semiconductor device 100 may include a substrate 110, a circuit layer 120, a conductive pad 130, a passivation layer 140, an organic dielectric layer 150, and a bump structure 160. The semiconductor device 100 may be a semiconductor chip. For example, the semiconductor device 100 may be a memory chip, a logic chip, or a buffer chip. The substrate 110 may be a semiconductor substrate. For example, the substrate 110 may include or may be formed of a semiconductor material, such as silicon, germanium, or silicon-germanium. The substrate 110 may have a first surface 110a and a second surface 110b opposite each other.

The circuit layer 120 may be provided on the first surface 110a of the substrate 110. As illustrated in FIG. 1C, the circuit layer 120 may include a dielectric layer 121, integrated circuits 125, and an interconnection structure 127. The integrated circuits 125 may be provided on the first surface 110a of the substrate 110. The integrated circuits 125 may include, for example, transistors and/or wirings electrically connecting the transistors. The dielectric layer 121 may be provided on the first surface 110a of the substrate 110 and may cover the integrated circuits 125. Although not shown for brevity, the dielectric layer 121 may include a plurality of stacked layers. The dielectric layer 121 may include or may be formed of a silicon-containing material. For example, the dielectric layer 121 may be an insulator layer or may include a plurality of insulator layers stacked in vertical direction. For example, the dielectric layer 121 may include or may be formed of silicon oxide, silicon nitride, silicon oxynitride, and/or tetraethylorthosilicate. The interconnection structure 127 may be provided in the dielectric layer 121. The interconnection structure 127 may be electrically connected to the integrated circuits 125. In this description, when an element is described to be electrically connected to a semiconductor device, the element may be electrically connected to integrated circuits of the semiconductor device so that signals can pass between the element and one or more of the integrated circuits. When two components are described to be electrically connected/coupled to each other, the two components may be directly connected/coupled to each other (e.g., so that they are physically touching and also connected to pass electronic signals between each other) or the two components may be indirectly connected/coupled to each other through other conductive component(s) (e.g., so that they do not physically contact each other, but they still are connected to pass electronic signals between each other). The interconnection structure 127 may include a wiring pattern and a via pattern connected to the wiring pattern. The wiring pattern and via pattern may be part of a plurality of wiring patterns and via patterns. Each wiring pattern may extend in a direction parallel to the first surface 110a of the substrate 110. For example, wiring pattern may have a major axis extending lengthwise along the wiring pattern and that extends in the direction parallel to the first surface 110a. The wiring patterns may include a plurality of wiring patterns interposed between layers (e.g., insulator layers) included in the dielectric layer 121. The via patterns may each have an axial symmetry, and a symmetry axis of the axial symmetry may intersect the first surface 110a of the substrate 110. For example, the symmetry axis of the via patterns may be perpendicular to the first surface 110a of the substrate 110. The via patterns may be provided in at least one of layers (e.g., insulator layers) included in the dielectric layer 121. For example, the dielectric layer 121 may include a plurality of sub layers (e.g., insulator layers) stacked together, and a via pattern may penetrate one of the sub layers. A plurality of via patterns may be included at different respective sub layers. Each via pattern may be provided between and coupled to a plurality of wiring patterns. Each of the wiring patterns may have a width less than that of a corresponding via pattern. In this case, the corresponding via pattern may be directly connected to one or more corresponding wiring patterns. The interconnection structure 127 may include metal, such as aluminum or copper.

The conductive pad 130 may be provided on/over the first surface 110a of the substrate 110. In this description, when a certain component is described as on another component, the certain component may be directly formed on the other component or a third component may be interposed between the certain component and the other component. For example, the conductive pad 130 may be provided on the circuit layer 120. The conductive pad 130 may be electrically connected through the interconnection structure 127 to the integrated circuits 125. The conductive pad 130 may be a chip pad. For example, a chip pad may be a conductor pad on which a solder ball or another solder material is applied and no other solder ball or material is applied between the chip pad and a semiconductor substrate in which a circuit and/or semiconductor devices are integrated. The conductive pad 130 may include or may be formed of metal, such as aluminum. Although not shown, a pad seed layer may further be interposed between the conductive pad 130 and the circuit layer 120. The pad seed layer may be used to form the conductive pad 130. The conductive pad 130 may include an edge part and a central part. When viewed in a plan, the edge part of the conductive pad 130 may surround the central part of the conductive pad 130. The edge part of the conductive pad 130 may include a sidewall of the conductive pad 130 and a part adjacent to the sidewall.

The passivation layer 140 may be provided on the first surface 110a of the substrate 110. The passivation layer 140 may cover the circuit layer 120. The passivation layer 140 may include a first passivation layer 141 and a second passivation layer 142. The first passivation layer 141 may be provided on the circuit layer 120, and may cover a top surface of the dielectric layer 121 and also cover the sidewall and the edge part of the conductive pad 130. The first passivation layer 141 may include a silicon-containing dielectric material. The first passivation layer 141 may include, for example, silicon oxide and/or tetraethylorthosilicate. The first passivation layer 141 may not include nitrogen. The second passivation layer 142 may be disposed on the first passivation layer 141. The second passivation layer 142 may have dielectric characteristics. The second passivation layer 142 may be a silicon-containing layer. The second passivation layer 142 may include a material different from that of the first passivation layer 141. For example, the second passivation layer 142 may include or may be formed of a silicon-containing dielectric material different from that of the first passivation layer 141. For example, both of the first and second passivation layers 141 and 142 may include silicon-containing dielectric materials different from each other. The second passivation layer 142 may include silicon and nitrogen. The second passivation layer 142 may include, for example, silicon nitride, silicon oxynitride, silicon carbonitride, and/or silicon carbon oxynitride. The passivation layer 140 may have a first opening 149, and the first opening 149 may expose a top surface of the conductive pad 130. The first opening 149 may penetrate the first passivation layer 141 and the second passivation layer 142. The first opening 149 may expose an inner wall 141c of the first passivation layer 141 and an inner wall 142c of the second passivation layer 142. For example, the inner wall 141c of the first passivation layer 141 may be a portion of a sidewall of the first opening 149 formed in the first passivation layer 141, and the inner wall 142c of the second passivation layer 142 may be another portion of the sidewall of the first opening 149 formed in the second passivation layer 142. The inner wall 142c of the second passivation layer 142 may be coplanar with the inner wall 141c of the first passivation layer 141. For example, the inner walls 141c and 142c collectively forming the sidewall of the first opening 149 may be linearly connected, e.g., in a cross-sectional view, and may have a substantially linear slope. For example, a top end of the inner wall 141c of the first passivation layer 141 and a bottom end of the inner wall 142c of the second passivation layer 142 may contact each other, and the inner walls 141c and 142c may have substantially the same inclination angle with respect to the first surface 110a of the substrate 110. The first opening 149 may have a width W1 less than a width of the conductive pad 130. For example, the width W1 of the first opening 149 may be equal to or greater than about 5 μm and less than about 10 μm. The width W1 may be a width/diameter of a lower portion of the first opening 149 or a width/diameter of a bottom surface/end of the first opening 149. The bottom surface of the first opening 149 may correspond to the exposed top surface of the conductive pad 130. For example, the passivation layer 140 may expose the top surface at the central part of the conductive pad 130. As shown in FIG. 1B, the first opening 149 may have a circular shape, e.g., when viewed in a plan. For example, the first opening 149 may have a truncated cone shape, and may have a circular top end and a circular bottom end. For example, the circular top end of the first opening 149 may have a greater diameter than the circular bottom end of the first opening 149.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The organic dielectric layer 150 may be disposed on a top surface of the passivation layer 140. For example, the organic dielectric layer 150 may cover a top surface of the second passivation layer 142. Unless otherwise stated in this description, the top surface of the passivation layer 140 may denote the top surface of the second passivation layer 142 in case the passivation layer 140 is composed of the first passivation layer 141 and the second passivation layer 142. The organic dielectric layer 150 may have a second opening 159. The organic dielectric layer 150 may have a top surface 150a and a bottom surface opposite each other, and the second opening 159 may penetrate the top surface 150a and the bottom surface of the organic dielectric layer 150. For example, the second opening 159 may penetrate the organic dielectric layer 150 including the top surface 150a and the bottom surface. When viewed in a plan, the second opening 159 may overlap the first opening 149. The second opening 159 may be spatially connected to the first opening 149. As shown in FIG. 1B, the second opening 159 may have a circular shape when viewed in a plan. For example, the second opening 159 may have a truncated cone shape, and may have a circular top end and a circular bottom end. For example, the circular top end of the second opening 159 may have a greater diameter than the circular bottom end of the second opening 159. The second opening 159 may have a diameter greater than that of the first opening 149. For example, the diameter of the circular bottom end of the second opening 159 may be greater than the diameter of the circular top end of the first opening 149. The second opening 159 may have a width W2 greater than the width W1 of the first opening 149. For example, the width W2 of the second opening 159 may be equal to or greater than about 10 μm and less than about 20 The width W2 may be a width/diameter measured at a bottom surface of the organic dielectric layer 150 or a width/diameter of the bottom surface/end of the second opening 159. The bottom surface of the organic dielectric layer 150 may contact the passivation layer 140. The second opening 159 may expose a portion of the top surface of the passivation layer 140 and an inner wall 150c of the organic dielectric layer 150. For example, the inner wall 150c of the organic dielectric layer 150 may be a sidewall of the second opening 159. The inner wall 150c of the organic dielectric layer 150 may not be aligned with the inner wall 142c of the second passivation layer 142. For example, a line formed by the inner wall 150c in a cross-sectional view may not be on the same line formed by the inner wall 142c in the cross-sectional view as shown in FIG. 1C. For example, the inner wall 150c and the inner wall 142 may not vertically overlap as shown in FIG. 1C. The passivation layer 140 may have a stepped structure formed by the inner wall and the exposed top surface thereof, and the organic dielectric layer 150 may also have a stepped structure formed by the inner wall 150c and the top surface 150a thereof. For example, the opening collectively formed by the first and second openings 149 and 159 may have a stepped sidewall having inclined portions formed by the inner walls 141c, 142c and 150c and a flat portion formed by the exposed top surface of the passivation layer 140. The organic dielectric layer 150 may be a polymer layer. The organic dielectric layer 150 may include, for example, polyimide. The polyimide may include a photosensitive polyimide.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.). For example, the term "contact," as used herein, refers to a direct connection (i.e., touching) unless the context indicates otherwise.

The bump structure 160 may be disposed on the top surface of the conductive pad 130 and coupled to the conductive pad 130. For example, the bump structure 160 may contact the conductive pad 130. The bump structure 160 may include a pillar pattern 161 and a solder pattern 165. For example, the solder pattern 165 may be a solder ball. The pillar pattern 161 may be provided on the top surface of the conductive pad 130 and in the first and second openings 149 and 159. The pillar pattern 161 may fill the first and second openings 149 and 159. As shown in FIG. 1B, the pillar pattern 161 may have a circular shape, e.g., when viewed in a plan. For example, a top surface 161a of the pillar pattern 161 may have a circular shape. The pillar pattern 161 may have a diameter greater than that of the second opening 159. For example, the top surface 161a of the pillar pattern 161 may have a diameter greater than the diameter of a top portion of the second opening 159. The pillar pattern 161 may have a width W3 greater than the width W2 of the second opening 159. For example, the width W3 of the pillar pattern 161 may be equal to or greater than 20 μm and may be equal to or less than about 70 μm. The width W3 may be a width/diameter of an upper portion of the pillar pattern 161. For example, the width W3 may be a width/diameter at the top surface 161a of the pillar pattern 161. The pillar pattern 161 may have a sidewall disposed on the top surface 150a of the organic dielectric layer 150, and the sidewall of the pillar pattern 161 disposed on the top surface 150a of the organic dielectric layer 150 may be substantially perpendicular to the top surface 150a of the organic dielectric layer 150. Therefore, the pillar pattern 161 may have a substantially uniform width/diameter at a range of level higher than the level of the top surface 150a of the organic dielectric layer 150. For example, a portion of the pillar pattern 161 disposed at the higher level than the top surface 150a of the organic dielectric layer 150 may have a cylindrical shape. As the width W3 of the pillar pattern 161 is greater than the width W2 of the second opening 159, the pillar pattern 161 may cover a portion of the top surface 150a of the organic dielectric layer 150. For example, the widths W1, W2 and W3 in the present disclosure may be widths/diameters of the pillar pattern 161 measured in a horizontal direction which is parallel to the top surface 110a of the substrate 110.

The top surface 161a of the pillar pattern 161 may be substantially flat. When a certain surface is described to be flat in this description, the surface may include an error possibly occurring in process of fabrication, and may exclude an intentional formation of step difference, protrusion, or recession. The top surface 161a of the pillar pattern 161 may be parallel to the first surface 110a of the substrate 110. The pillar pattern 161 may have a bottom surface 161b opposite to the top surface 161a. For example, the bottom surface 161b of the pillar pattern 161 may face and/or contact top surfaces formed below the pillar pattern 161, e.g., the conductive pad 130, the passivation layer 140 and/or the organic dielectric layer 150. The bottom surface 161b of the pillar pattern 161 may have a step difference caused by the passivation layer 140 and the organic dielectric layer 150. For example, the bottom surface 161b of the pillar pattern 161 may include a first bottom surface 161x, a second bottom surface 161y, and a third bottom surface 161z. The first bottom surface 161x of the pillar pattern 161 may be in contact with the top surface 150a of the organic dielectric layer 150. The second bottom surface 161y of the pillar pattern 161 may be located at a level lower than that of the first bottom surface 161x. The second bottom surface 161y of the pillar pattern 161 may be in contact with the top surface of the passivation layer 140. The third bottom surface 161z of the pillar pattern 161 may be located at a level lower than that of the second bottom surface 161y. The third bottom surface 161z of the pillar pattern 161 may be in contact with the conductive pad 130. In this description, the language "level" may indicate a vertical level, and the term "vertical" may correspond to a direction vertical to the first surface 110a of the substrate 110. A difference in level between two surfaces may be measured in a direction perpendicular to the first surface 110a of the substrate 110.

The second passivation layer 142 may serve as an adhesive layer, e.g. for attachment of the pillar pattern 161 to the lower structure (passivation layer/dielectric layer/substrate). As the pillar pattern 161 is in contact with the second passivation layer 142, the pillar pattern 161 may be stably attached to the dielectric layer 121 and the first passivation layer 141. For example, an adhesive force between the pillar pattern 161 and the second passivation layer 142 may be greater than an adhesive force between the pillar pattern 161 and the dielectric layer 121. The adhesive force between the pillar pattern 161 and the second passivation layer 142 may be greater than an adhesive force between the pillar pattern 161 and the first passivation layer 141.

The organic dielectric layer 150 may have greater softness than that of the second passivation layer 142. The organic dielectric layer 150 may have relatively low hardness. For example, the organic dielectric layer 150 may have lower hardness than that of the second passivation layer 142. Therefore, the organic dielectric layer 150 may relieve stress applied to the bump structure 160. The stress may be physical stress. For example, the stress may be pressure applied to the bump structure 160 in a mounting process, e.g., on a redistribution substrate, a package substrate or a circuit board. A contact area between the pillar pattern 161 and the organic dielectric layer 150 may be greater than a contact area between the pillar pattern 161 and the second passivation layer 142, which may be beneficial to reduce the stress applied to the bump structure 160. Accordingly, the pillar pattern 161 may be prevented/protected from being damaged during mounting the semiconductor device 100, e.g., on a redistribution substrate, a package substrate or a circuit board. The contact area between the pillar pattern 161 and the organic dielectric layer 150 may include a contact area between the pillar pattern 161 and the inner wall 150c of the organic dielectric layer 150 and a contact area between the pillar pattern 161 and the top surface 150a of the organic dielectric layer 150. The contact area between the pillar pattern 161 and the second passivation layer 142 may include a contact area between the pillar pattern 161 and the inner wall 142c of the second passivation layer 142 and a contact area between the pillar pattern 161 and the top surface of the second passivation layer 142.

The pillar pattern 161 may include a seed pattern 162 and a conductive pattern 163. The seed pattern 162 may be disposed on the top surface of the conductive pad 130, and may extend onto the passivation layer 140 and the organic dielectric layer 150. The seed pattern 162 may conformally cover the exposed top surface of the conductive pad 130, the inner wall and the top surface of the passivation layer 140, and the inner wall 150c and a portion of the top surface 150a of the organic dielectric layer 150. The seed pattern 162 may be in physical contact with the exposed top surface of the conductive pad 130, the inner wall and the top surface of the passivation layer 140, and the inner wall 150c and the top surface 150a of the organic dielectric layer 150. Unless otherwise stated in this description, the inner wall of the passivation layer 140 may include the inner wall 141c of the first passivation layer 141 and the inner wall 142c of the second passivation layer 142. The term "physical contact," as used herein, refers to a direct connection (i.e., touching) similarly to "contact" as described above unless the context indicates otherwise. The seed pattern 162 may include, for example, at least one selected from titanium and copper. The bottom surface 161b of the pillar pattern 161 may indicate a bottom surface of the seed pattern 162. The conductive pattern 163 may be formed on the seed pattern 162. The conductive pattern 163 may include metal, such as copper, nickel, or an alloy thereof. The conductive pattern 163 may be formed by an electroplating process in which the seed pattern 162 is used as an electrode. The seed pattern 162 may expose an upper sidewall 163c of the conductive pattern 163. The upper sidewall 163c of the conductive pattern 163 may be located at a higher level than that of the top surface 150a of the organic dielectric layer 150. The top surface 161a of the pillar pattern 161 may indicate a top surface of the conductive pattern 163.

The solder pattern 165 may be provided on the top surface 161a of the pillar pattern 161 and electrically connected to the pillar pattern 161. The solder pattern 165 may include a different material from that of the pillar pattern 161. For example, the solder pattern 165 may include tin (Sn), silver (Ag), zinc (Zn), lead (Pb), or an alloy thereof.

For brevity of illustration of the pillar pattern 161 in figures other than FIGS. 1C, 2A to 2D, and 4B, no distinction will be made between the seed pattern 162 and the conductive pattern 163. However, it is not intended to exclude the seed pattern 162 and/or the conductive pattern 163 from the embodiments. Furthermore, figures other than FIGS. 1C, 2A to 2D, and 4B omit the illustration of the dielectric layer 121, the integrated circuits 125, and the interconnection structure 127, but it is not intended to exclude any of the dielectric layer 121, the integrated circuits 125, and the interconnection structure 127 from the present inventive concepts. The omission of these features in the figures is just for brevity of illustration, and any feature disclosed in this application and compatible with the figures may be applied to the figures. Similarly, other compatible and/or interchangeable features may be applied and/or interchanged across embodiments of the present disclosure.

Figure 2A:
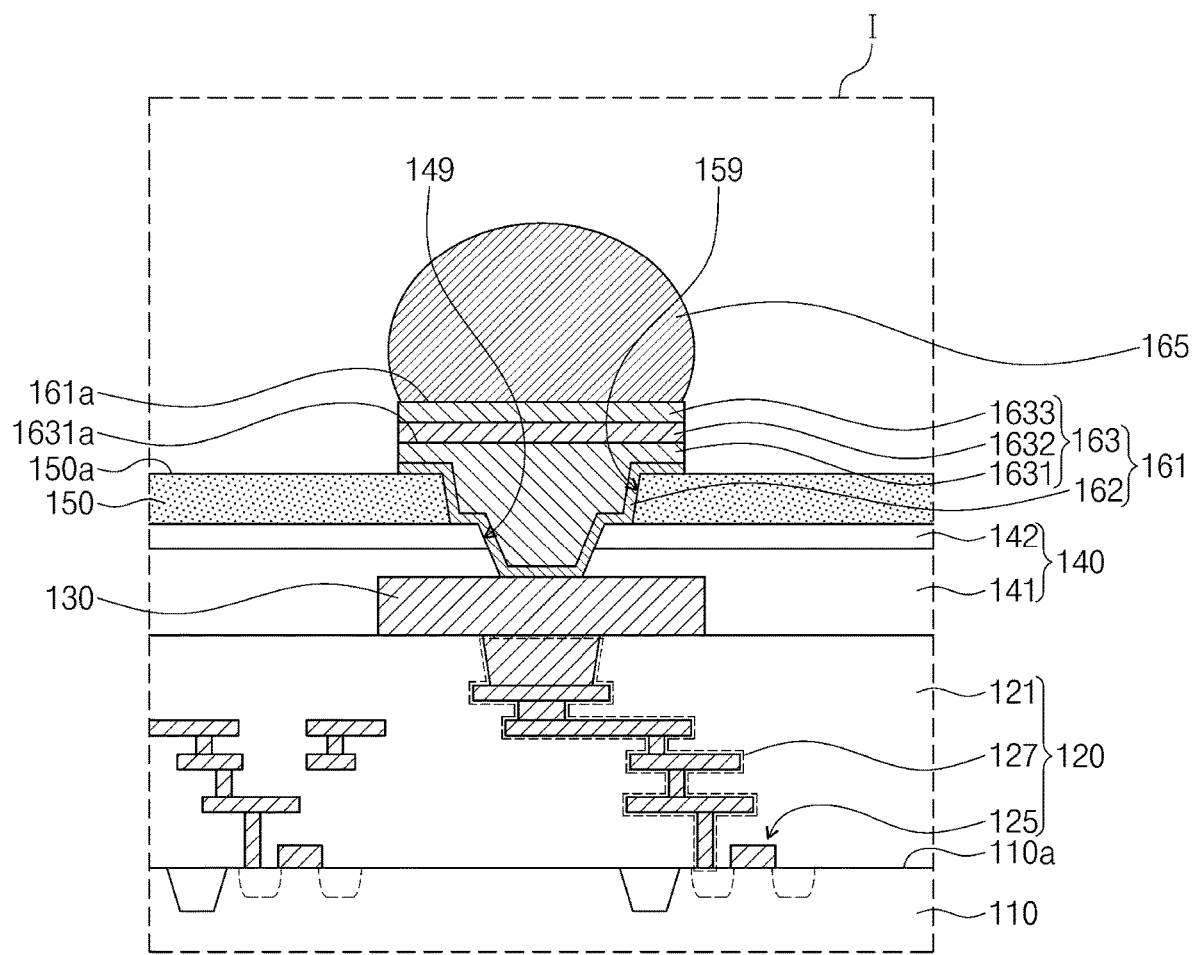
FIG. 2A illustrates a cross-sectional view showing a bump structure of a semiconductor device according to some example embodiments.

FIG. 2A illustrates an enlarged cross-sectional view taken along line II-III of FIG. 1B and corresponding to section I of FIG. 1A, showing a bump structure of a semiconductor device according to some example embodiments. The following will refer to FIGS. 1A and 1B together with FIG. 2A, and omission will be made to avoid repetitive description.

Referring to FIG. 2A, a semiconductor device may include a substrate 110, a circuit layer 120, a conductive pad 130, a passivation layer 140, an organic dielectric layer 150, a seed pattern 162, a conductive pattern 163, and a solder pattern 165. The seed pattern 162, the conductive pattern 163, and the solder pattern 165 may be substantially the same as those discussed above in reference to FIGS. 1A to 1C. However, the conductive pattern 163 may be formed of multiple layers as illustrated in FIG. 2A, which is different from the conductive pattern 163 of the embodiment illustrated in FIG. 1C in that the conductive pattern 163 of FIG. 1C is a single layer. For example, the conductive pattern 163 may include vertically stacked conductive layers including a first conductive part/layer 1631, a second conductive part/layer 1632, and a third conductive part/layer 1633. The first conductive part 1631 may correspond to a lower portion of the conductive pattern 163. The first conductive part 1631 may cover the seed pattern 162. The first conductive part 1631 may be provided in the first and second openings 149 and 159, and may be disposed on a portion of the top surface 150a of the organic dielectric layer 150. The first conductive part 1631 may have a top surface at a higher level than that of the top surface 150a of the organic dielectric layer 150. The top surface of the first conductive part 1631 may be substantially flat. The first conductive part 1631 may include or may be formed of a first metal. The first metal may be, for example, copper, nickel, tungsten, aluminum, etc.

The second conductive part 1632 may be disposed on the first conductive part 1631. The second conductive part 1632 may be spaced apart from the seed pattern 162. For example, the first conductive part/layer 1631 may be interposed in all area between the seed pattern 162 and the second conductive part/layer 1632 and may fill the gap between the seed pattern 162 and the second conductive part/layer 1632 as shown in FIG. 2A. The second conductive part 1632 may include or may be formed of a second metal different from the first metal. The second metal may be, for example, nickel copper, tungsten, aluminum, etc. The second conductive part 1632 may have a top surface that is substantially flat.

The third conductive part 1633 may be disposed on the second conductive part 1632. The second conductive part 1632 may be interposed between the first conductive part 1631 and the third conductive part 1633. For example, the second conductive part/layer 1632 may be interposed in all area between the first conductive part/layer 1631 and the third conductive part/layer 1633 and may fill the gap between the first conductive part/layer 1631 and the third conductive part/layer 1633 as shown in FIG. 2A. The third conductive part 1633 may include or may be formed of the first metal. For example, the third conductive part 1633 may include the same metal as that of the first conductive part 1631. According to some example embodiments, as the conductive pattern 163 includes the first, second, and third conductive parts 1631, 1632, and 1633, it may be beneficial to adjust characteristics of the conductive pattern 163.

Figure 2B:
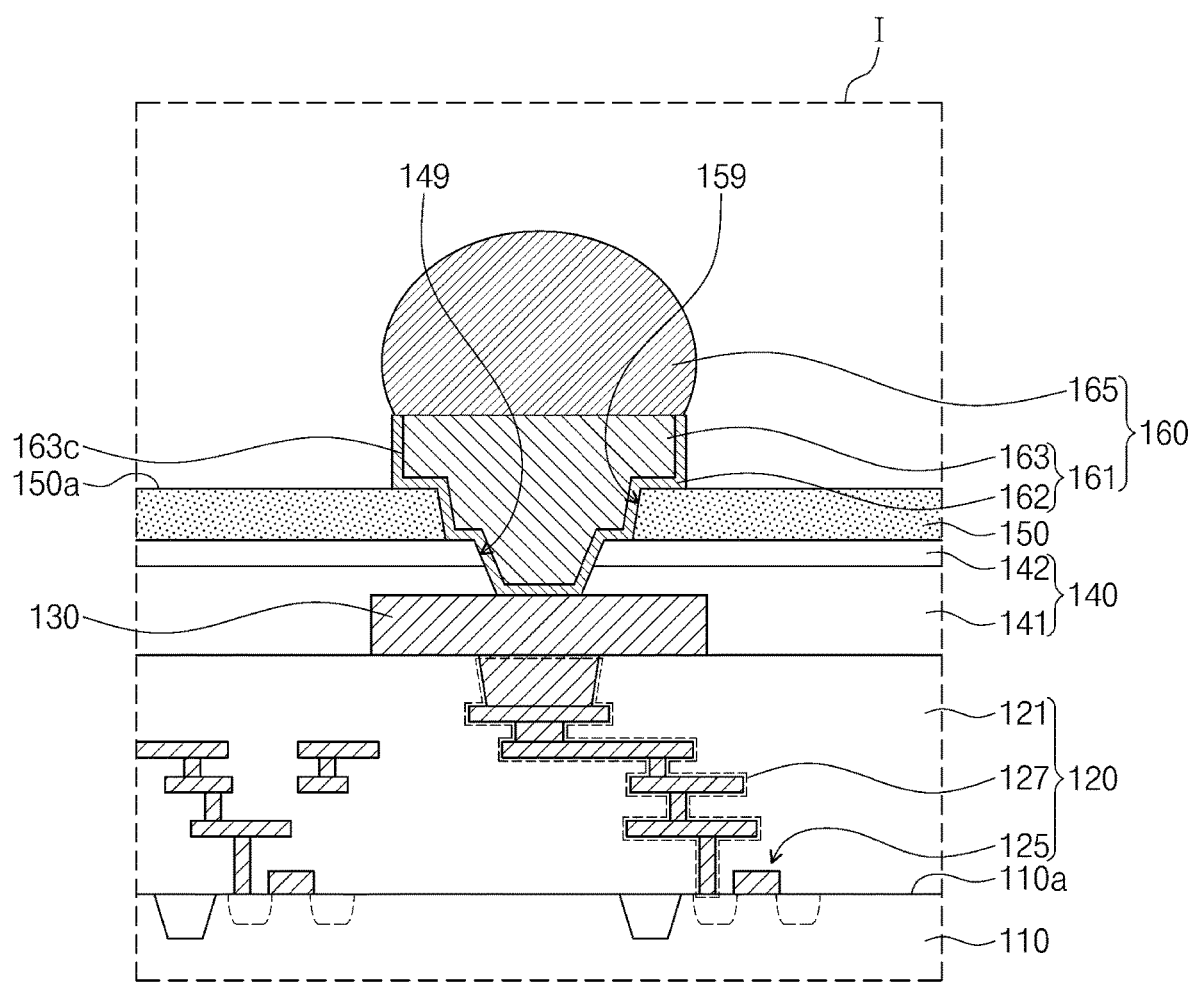
FIG. 2B illustrates a cross-sectional view showing a bump structure of a semiconductor device according to some example embodiments.

FIG. 2B illustrates an enlarged cross-sectional view taken along line II-III of FIG. 1B and corresponding to section I of FIG. 1A, showing a bump structure of a semiconductor device according to some example embodiments. The following will refer to FIGS. 1A and 1B together with FIG. 2B, and omission will be made to avoid repetitive description.

Referring to FIG. 2B, a semiconductor device may include a substrate 110, a circuit layer 120, a conductive pad 130, a passivation layer 140, an organic dielectric layer 150, a pillar pattern 161 including a seed pattern 162 and a conductive pattern 163, and a solder pattern 165. The pillar pattern 161, and the solder pattern 165 may be substantially the same as those discussed above in FIGS. 1A to 1C. However, in the embodiment illustrated in FIG. 2B, the seed pattern 162 may extend onto and cover the upper sidewall 163c of the conductive pattern 163. The seed pattern 162 may have an uppermost surface at substantially the same level as that of the top surface of the conductive pattern 163. Alternatively, the conductive pattern 163 may include the first, second, and third conductive parts 1631, 1632, and 1633 as discussed in FIG. 2A.

In the embodiments of FIGS. 2A and 2B, the substrate 110, the circuit layer 120, the organic dielectric layer 150 may be substantially the same as those discussed above in FIGS. 1A to 1C.

Figure 2C:
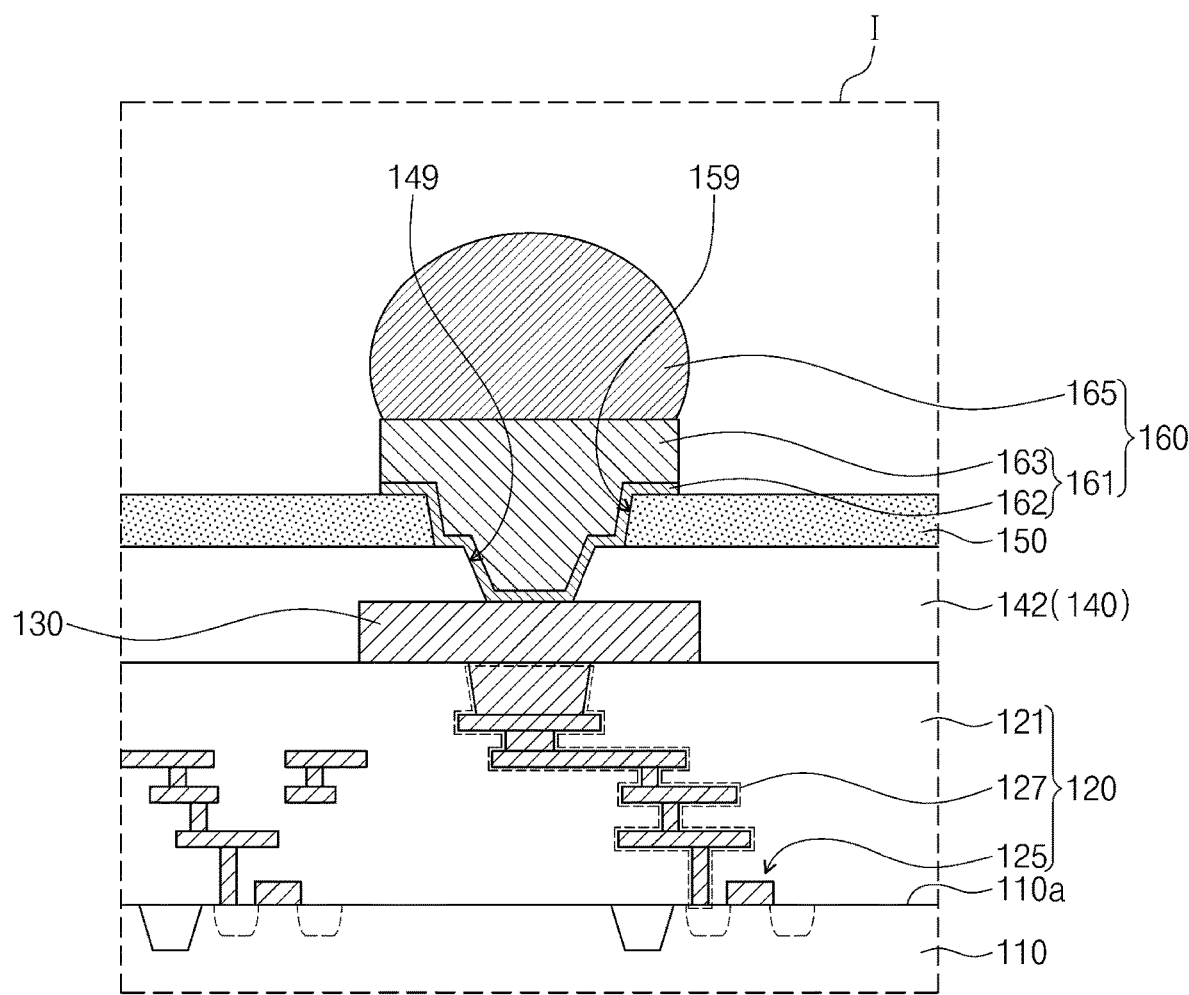
FIG. 2C illustrates a cross-sectional view showing a passivation layer of a semiconductor device according to some example embodiments.

FIG. 2C illustrates an enlarged cross-sectional view taken along line II-III of FIG. 1B and corresponding to section I of FIG. 1A, showing a passivation layer of a semiconductor device according to some example embodiments. The following will refer to FIGS. 1A and 1B together with FIG. 2C, and omission will be made to avoid repetitive description.

Referring to FIG. 2C, a semiconductor device may include a substrate 110, a circuit layer 120, a conductive pad 130, a passivation layer 140, an organic dielectric layer 150, and a bump structure 160. The passivation layer 140 may be formed of a single layer. For example, the passivation layer 140 may include the second passivation layer 142, but may not include the first passivation layer 141 discussed in FIG. 1C. The second passivation layer 142 may be in physical contact with a top surface of the circuit layer 120 and a bottom surface of the organic dielectric layer 150. The second passivation layer 142 may be in contact with the conductive pad 130. For example, the second passivation layer 142 may be in physical contact with the sidewall of the conductive pad 130 and with the top surface at the edge part of the conductive pad 130. The conductive pad 130 may be disposed in the second passivation layer 142. As discussed above, the second passivation layer 142 may be a silicon-containing layer. The second passivation layer 142 may include silicon and nitrogen. The second passivation layer 142 may include, for example, silicon nitride, silicon oxynitride, silicon carbonitride, and/or silicon carbon oxynitride. According to some example embodiments, the pillar pattern 161 and the second passivation layer 142 may have therebetween an increased contact area, such that the pillar pattern 161 may be stably attached to the conductive pad 130/the dielectric layer 121/semiconductor device 100. For example, the inclined sidewalls of the first and second openings 149 and 159, the exposed top surface of the passivation layer 140, the pillar pattern 161 on a portion of the top surface of the organic dielectric layer 150 and/or the respective materials of the layers and patterns may be beneficial for a reliable attachment of the bump structure 160 on the conductive pad 130 and to the semiconductor device 100.

Figure 2D:
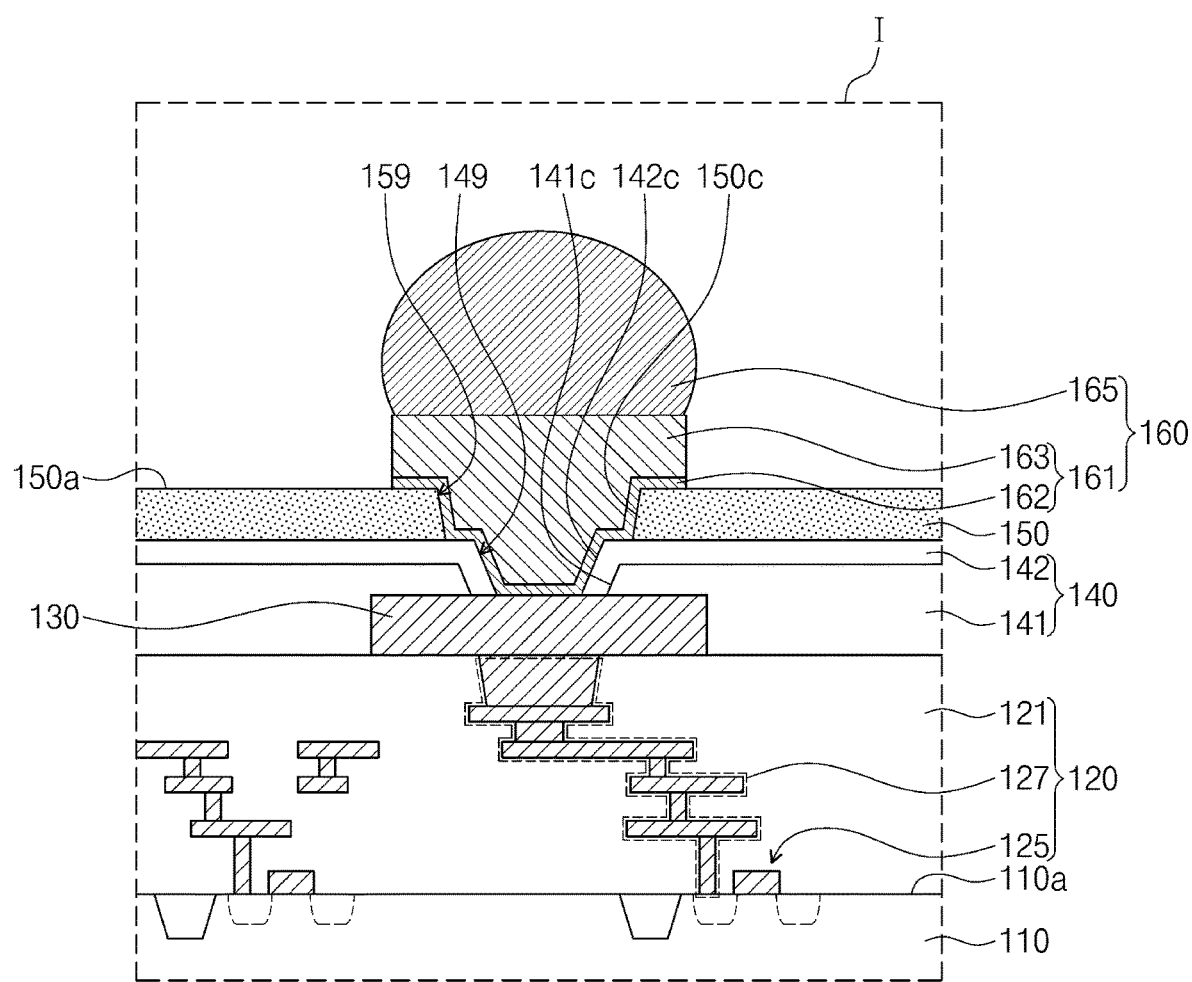
FIG. 2D illustrates a cross-sectional view showing a passivation layer of a semiconductor device according to some example embodiments.

FIG. 2D illustrates an enlarged cross-sectional view taken along line II-III of FIG. 1B and corresponding to section I of FIG. 1A, showing a passivation layer of a semiconductor device according to some example embodiments. The following will refer to FIGS. 1A and 1B together with FIG. 2D, and omission will be made to avoid repetitive description.

Referring to FIG. 2D, a semiconductor device may include a substrate 110, a circuit layer 120, a conductive pad 130, a first passivation layer 141, a second passivation layer 142, an organic dielectric layer 150, and a bump structure 160. The first and second passivation layers 141 and 142 may be similar to those discussed above in reference to FIGS. 1A to 1C. However, in the embodiment illustrated in FIG. 2D, the second passivation layer 142 may be provided on a top surface of the first passivation layer 141 and may cover the inner wall 141c of the first passivation layer 141. The second passivation layer 142 may be in contact with a portion of the top surface of the conductive pad 130. The first opening 149 may expose the inner wall 142c of the second passivation layer 142, but may not expose the first passivation layer 141.

The pillar pattern 161 may be provided in the first and second openings 149 and 159, and may be in contact with the inner wall 142c of the second passivation layer 142 and with the inner wall 150c and the top surface 150a of the organic dielectric layer 150. As the second passivation layer 142 extends onto the inner wall 141c of the first passivation layer 141, the pillar pattern 161 and the second passivation layer 142 may have therebetween an increased contact area. Therefore, the second passivation layer 142 may be helpful for the pillar pattern 161 to be stably fixed to the first passivation layer 141. For example, the first and second passivation layers 141 and 142 and the pillar pattern 161 may be respectively made of such materials that the adhesion between the second passivation layer 142 and the pillar pattern 161 may be stronger than the adhesion between the first passivation layer 141 and the pillar pattern 161, and the adhesion between the first passivation layer 141 and the second passivation layer 142 may be stronger than the adhesion between the first passivation layer 141 and the pillar pattern 161. The pillar pattern 161 may be spaced apart from the inner wall 141c of the first passivation layer 141, e.g., as the second passivation layer 142 is interposed therebetween.

In the embodiments of FIGS. 2C and 2D, the substrate 110, the circuit layer 120, the organic dielectric layer 150, and the bump structure 160 may be substantially the same as those discussed above with reference to FIGS. 1A to 1C. Alternatively, the bump structure 160 may be substantially the same as that discussed with reference to FIG. 2A or 2B.

The following will describe a semiconductor package including a semiconductor device according to the present inventive concepts. A duplicate description will be omitted below for brevity.

Figure 3:
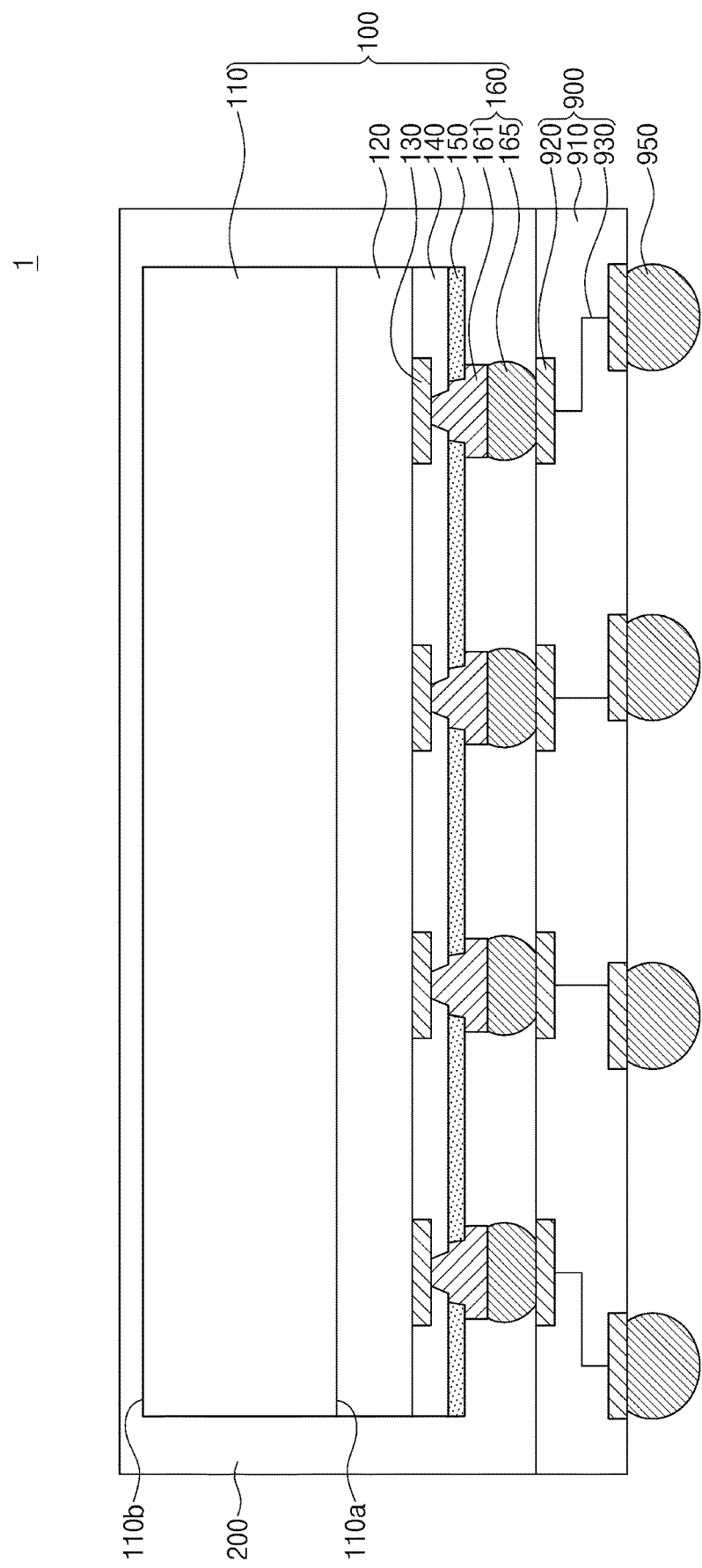
FIG. 3 illustrates a cross-sectional view showing a semiconductor package according to some example embodiments.

FIG. 3 illustrates a cross-sectional view showing a semiconductor package according to some example embodiments.

Referring to FIG. 3, a semiconductor package 1 may include a package substrate 900, a semiconductor device 100, and a molding layer 200. The package substrate 900 may have a top surface and a bottom surface opposite to each other. The package substrate 900 may include a dielectric base layer 910, a substrate pad 920, and an internal line 930. The dielectric base layer 910 may include a single layer or a plurality of layers. The substrate pad 920 may be exposed on the top surface of the package substrate 900. The internal line 930 may be disposed in the dielectric base layer 910 and coupled to the substrate pad 920. A solid line in the dielectric base layer 910 is schematically illustrated to indicate the internal line 930. In this description, when an element is described to be electrically connected to the package substrate 900, the element may be electrically connected to the internal line 930. This may be similarly applied to other elements. The substrate pad 920 and the internal line 930 may include metal, such as copper, aluminum, tungsten, and/or titanium. For example, the package substrate 900 may be a printed circuit board (PCB) having a circuit pattern. In certain embodiments, a redistribution layer may be used as the package substrate 900. When a redistribution substrate is used as the package substrate 900, the dielectric base layer 910 may include a photosensitive polymer. When a redistribution substrate is used as the package substrate 900, the internal line 930 may include a seed layer and a metal layer on the seed layer. For example, the seed layer may be a layer helpful for nucleation of a metal to form the metal layer.

An external terminal 950 may be provided on the bottom surface of the package substrate 900 and coupled to the internal line 930. External electrical signals may be transmitted through the external terminal 950 to the internal line 930. The external terminal 950 may include a solder ball. The external terminal 950 may include or may be formed of metal, such as a solder material (e.g., tin, copper, silver, bismuth, indium, zinc, antimony, lead, etc.).

The semiconductor device 100 may be mounted on the package substrate 900. The semiconductor device 100 may be disposed on the package substrate 900 to allow the bump structure 160 of the semiconductor device 100 to face the package substrate 900. The bump structure 160 may be aligned with the substrate pad 920. The bump structure 160 may be in contact with the substrate pad 920. The mounting of the semiconductor device 100 on the package substrate 900 may include performing a bonding process on the bump structure 160. The bonding process may be a soldering process. For example, the soldering process may include performing an annealing process on the bump structure 160. The annealing process may be executed at a temperature greater than a melting point of the solder pattern 165. At this step, the bump structure 160 may further be supplied with external force, such as pressure. As the pillar pattern 161 is in contact with the organic dielectric layer 150, the organic dielectric layer 150 may relieve stress applied to the pillar pattern 161 in the bonding process. Accordingly, during the soldering process, the pillar pattern 161 may be prevented/protected from being damaged. The solder pattern 165 may be bonded to the substrate pad 920 during the bonding process, and thus integrated circuits of the semiconductor device 100 may be electrically connected through the bump structure 160 to the package substrate 900.

The molding layer 200 may be disposed on the top surface of the package substrate 900. The molding layer 200 may cover a top surface and a sidewall (e.g., each of the sidewalls) of the semiconductor device 100. In certain embodiments, the molding layer 200 may cover the sidewall of the semiconductor device 100, but may expose the top surface of the semiconductor device 100. The molding layer 200 may extend into a gap between the package substrate 900 and the semiconductor device 100, thereby encapsulating the bump structure 160. Alternatively, an under-fill layer (not shown) may be provided between the package substrate 900 and the semiconductor device 100. The molding layer 200 may include a dielectric polymer, such as an epoxy-based molding compound.

Figure 4A:
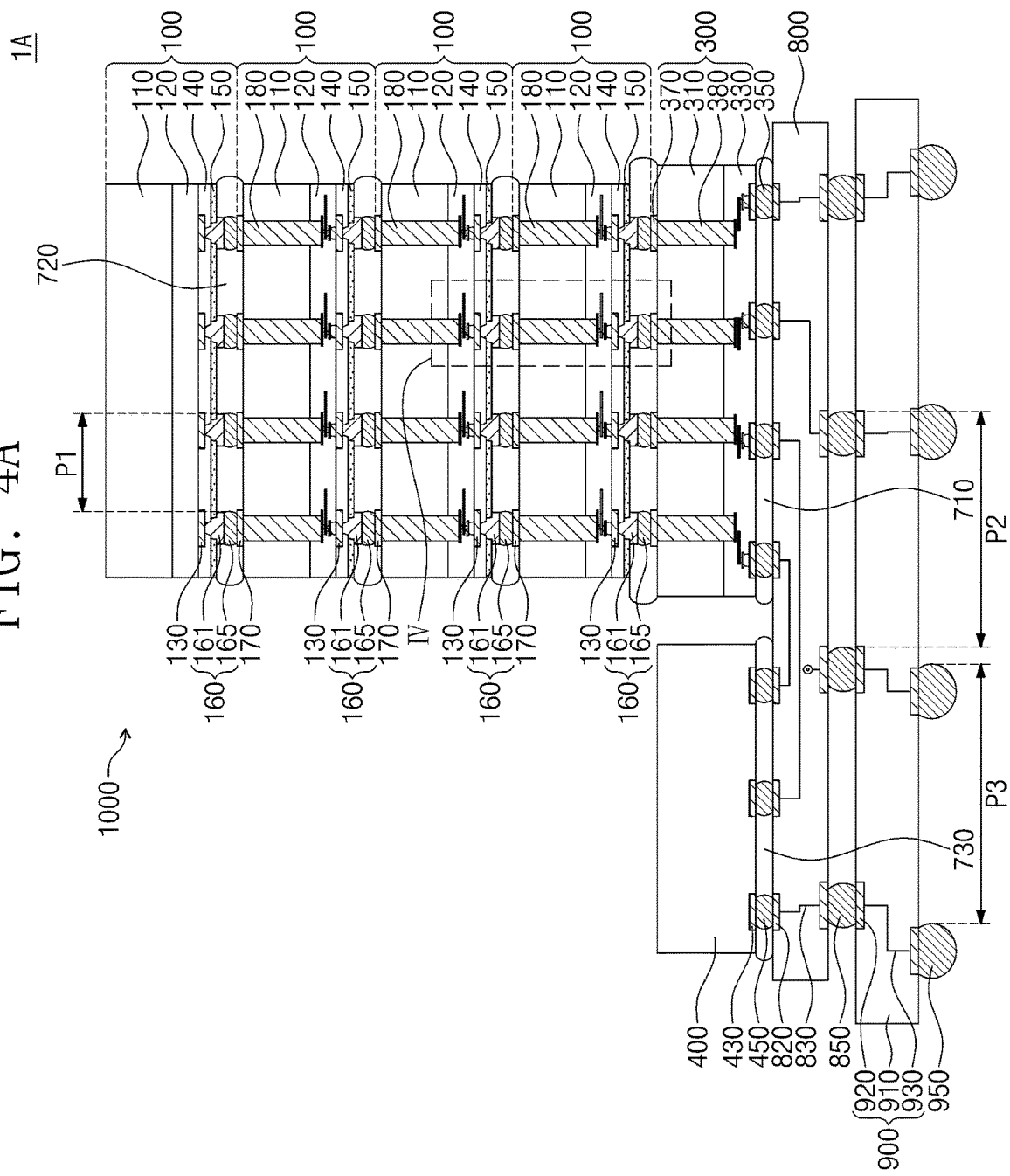
FIG. 4A illustrates a cross-sectional view showing a semiconductor package according to some example embodiments.
Figure 4B:
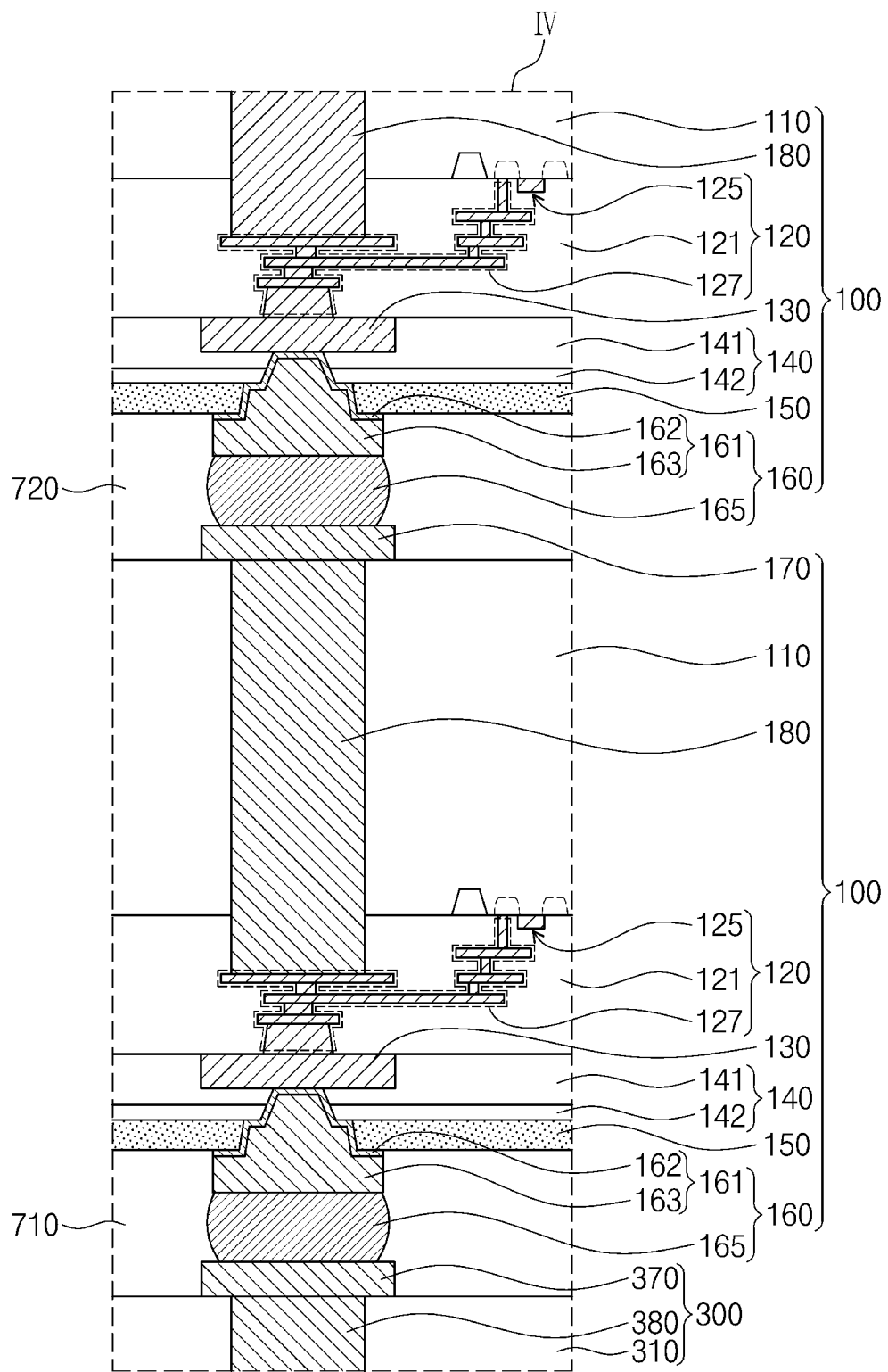
FIG. 4B illustrates an enlarged view showing section IV of FIG. 4A.

FIG. 4A illustrates a cross-sectional view showing a semiconductor package according to some example embodiments. FIG. 4B illustrates an enlarged view showing section IV of FIG. 4A. A duplicate description will be omitted below for brevity.

Referring to FIGS. 4A and 4B, a semiconductor package 1A may include a package substrate 900, an interposer substrate 800, and a chip stack 1000. The package substrate 900 may be substantially the same as that discussed in reference to FIG. 3. A plurality of external terminals 950 may be provided on a bottom surface of the package substrate 900.

The interposer substrate 800 may be disposed on the package substrate 900. The interposer substrate 800 may include a metal pad 820 and a metal line 830. The metal pad 820 may be exposed on a top surface of the interposer substrate 800. The metal line 830 may be provided in the interposer substrate 800 and coupled to the metal pad 820. In this description, when an element is described to be electrically connected to the interposer substrate 800, the element may be electrically connected to the metal line 830. The metal pad 820 and the metal line 830 may include metal, such as copper, aluminum, tungsten, and/or titanium. An interposer bump 850 may be interposed between and coupled to the package substrate 900 and the interposer substrate 800. For example, the interposer bump 850 may be coupled to the substrate pad 920 and the metal line 830. The interposer bump 850 may be a solder ball or another solder structure (e.g., a solder pillar). The interposer bump 850 may include or may be formed of metal, such as a solder material (e.g., tin, copper, silver, bismuth, indium, zinc, antimony, lead, etc.).

The chip stack 1000 may be mounted on the top surface of the interposer substrate 800. The chip stack 1000 may include a first semiconductor chip 300 and a plurality of semiconductor devices 100. The first semiconductor chip 300 may be mounted on the top surface of the interposer substrate 800. The first semiconductor chip 300 may be one of a logic chip, a buffer chip, and a system-on-chip. For example, integrated circuits (not shown) of the first semiconductor chip 300 may include logic circuits, and the first semiconductor chip 300 may serve as a logic chip. For example, the logic chip may be a central processing unit (CPU), a graphic processing unit (GPU), or another processor. The first semiconductor chip 300 may include a base substrate 310, a circuit pattern 330, a conductive through electrode 380, and an upper conductive pad 370. The base substrate 310 may be a semiconductor substrate. The circuit pattern 330 may have integrated circuits therein. The upper conductive pad 370 may be disposed on a top surface of the first semiconductor chip 300. The conductive through electrode 380 may be provided in the base substrate 310 and coupled to the upper conductive pad 370. A first bonding bump 350 may be interposed between and electrically connected to the interposer substrate 800 and the first semiconductor chip 300. In this description, the phrase "electrically connected to a semiconductor chip" may mean "electrically connected to integrated circuits of the semiconductor chip". For example, the first bonding bump 350 may be electrically connected to the integrated circuits of the first semiconductor chip 300. The first bonding bump 350 may include at least one selected from solder balls and pillars. The first bonding bump 350 may include or may be formed of metal, such as a solder material (e.g., tin, copper, silver, bismuth, indium, zinc, antimony, lead, etc.). A plurality of first bonding bumps 350 may be provided between the interposer substrate 800 and the first semiconductor chip 300, and at least one of the first bonding bumps 350 may be electrically connected to the conductive through electrode 380.

The semiconductor devices 100 may be stacked on the first semiconductor chip 300. The semiconductor devices 100 may each be of a different type from that of the first semiconductor chip 300. For example, the semiconductor devices 100 may be memory chips.

The memory chips may include high bandwidth memory (HBM) chips. Each of the semiconductor devices 100 may include a substrate 110, a circuit layer 120, a conductive pad 130, a passivation layer 140, an organic dielectric layer 150, and a bump structure 160. The substrate 110, the circuit layer 120, the conductive pad 130, the passivation layer 140, the organic dielectric layer 150, and the bump structure 160 may be substantially the same as those discussed with reference to FIGS. 1A to 1C. Alternatively, the bump structure 160 may be substantially the same as that discussed with reference to FIG. 2A or 2B, and/or the passivation layer 140 may be substantially the same as that discussed with reference to FIG. 2C or 2D.

Each of the semiconductor devices 100 may further include a through electrode 180 and an upper pad 170. The upper pad 170 may be disposed on a top surface of the semiconductor device 100. The through electrode 180 may be provided in the substrate 110. A top end of the through electrode 180 may be coupled to the upper pad 170. As shown in FIG. 4B, a bottom end of the through electrode 180 may be coupled through the interconnection structure 127 to at least one selected from the conductive pad 130 and the integrated circuits 125. Therefore, the upper pad 170 may be coupled through the through electrode 180 to at least one selected from the conductive pad 130 and the integrated circuits 125. An uppermost semiconductor device 100 may include neither the through electrode 180 nor the upper pad 170.

The semiconductor devices 100 may include a lower semiconductor device 100 and an upper semiconductor device 100 that neighbor each other. The upper semiconductor device 100 may be disposed on a top surface of the lower semiconductor device 100. The bump structure 160 of the upper semiconductor device 100 may be coupled to the upper pad 170 of the lower semiconductor device 100. Accordingly, a plurality of semiconductor devices 100 may be electrically connected to each other. The bump structure 160 of a lowermost semiconductor device 100 may be coupled to the upper conductive pad 370 of the first semiconductor chip 300. Therefore, the semiconductor devices 100 may be electrically connected to the package substrate 900.

As shown in FIG. 4A, each of the semiconductor devices 100 may include a plurality of bump structures 160, and a fine pitch P1 may be provided between the plurality of bump structures 160. For example, interposer bumps 850 interposed between the interposer substrate 800 and the package substrate 900 may have a pitch P2 as shown in FIG. 4A, and the pitch P1 of the bump structures 160 may be less than the pitch P2 of the interposer bumps 850 and less than a pitch P3 of the external terminals 950. A pitch of certain components may be a period at which the certain components are repetitively disposed.

The semiconductor package 1A may further include a second semiconductor chip 400. The second semiconductor chip 400 may be mounted on the top surface of the interposer substrate 800. The second semiconductor chip 400 may be laterally spaced apart from the first semiconductor chip 300. The second semiconductor chip 400 may be of a different type from that of the first semiconductor chip 300 and that of the semiconductor devices 100. The second semiconductor chip 400 may include a central processing unit (CPU) or a graphic processing unit (GPU). A second bonding bump 450 may be provided between a chip pad 430 of the second semiconductor chip 400 and a corresponding metal pad 820 among a plurality of metal pads 820 formed on the top surface of the interposer substrate 800 as shown in FIG. 4A. The second bonding bump 450 may include at least one selected from solder balls and pillars. The second bonding bump 450 may include or may be formed of metal, such as a solder material (e.g., tin, copper, silver, bismuth, indium, zinc, antimony, lead, etc.). A plurality of second bonding bumps 450 may be provided between the second semiconductor chip 400 and the interposer substrate 800, and the respective second bonding bumps 450 may contact corresponding chip pads 430 formed on a bottom surface of the second semiconductor chip 400 and may contact corresponding metal pads 820 formed on the top surface of the interposer substrate 800. The plurality of second bonding bumps 450 may have a pitch less than the pitch P3 of the external terminals 950. The second semiconductor chip 400 may be electrically connected through the second bonding bumps 450 and the metal line 830 of the interposer substrate 800 to either the first semiconductor chip 300 or the semiconductor devices 100. For example, the second semiconductor chip 400 may be electrically connected to the first semiconductor chip 300 and/or one or more of the semiconductor devices 100 through the second bonding bumps 450 and the metal line 830.

The semiconductor package 1A may further include at least one selected from a first under-fill pattern 710, a second under-fill pattern 720, and a third under-fill pattern 730. The first under-fill pattern 710 may be provided in a gap between the interposer substrate 800 and the first semiconductor chip 300, and may encapsulate the first bonding bump 350. The first under-fill pattern 710 may include a dielectric polymer, such as an epoxy-based polymer. A plurality of second under-fill patterns 720 may be provided in gaps between the semiconductor devices 100, and may encapsulate corresponding bump structures 160. The second under-fill pattern 720 may include a dielectric polymer, such as an epoxy-based polymer. The third under-fill pattern 730 may be provided in a gap between the interposer substrate 800 and the second semiconductor chip 400, and may encapsulate the second bonding bump 450. The third under-fill pattern 730 may include a dielectric polymer, such as an epoxy-based polymer.

The semiconductor package 1A may further include a molding layer (not shown). The molding layer may be provided on the top surface of the interposer substrate 800, and may cover the chip stack 1000 and the second semiconductor chip 400.

According to the present inventive concepts, a bump structure may be in physical contact with a passivation layer and an organic dielectric layer. As the bump structure is in contact with the organic dielectric layer, the organic dielectric layer may relieve stress applied to the bump structure. As the bump structure is in contact with the passivation layer, the bump structure may be stably fixed to a circuit layer. Accordingly, the bump structure and a semiconductor device including the same may have increased reliability and durability.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scope of the invention is to be determined by the broadest interpretation of the following claims and their equivalents, and shall not be restricted or limited by the foregoing description.

What is claimed is:

1. A semiconductor device, comprising:
a semiconductor substrate;
a conductive pad on a first surface of the semiconductor substrate;
a passivation layer on the first surface of the semiconductor substrate, the passivation layer having a first opening that exposes a portion of the conductive pad;
an organic dielectric layer on the passivation layer, the organic dielectric layer having a second opening; and
a bump structure on the conductive pad and in the first and second openings,
wherein the organic dielectric layer includes a material different from a material of the passivation layer,
wherein the second opening is spatially connected to the first opening and exposes a portion of the passivation layer,
wherein the bump structure includes a pillar pattern in contact with the passivation layer and the organic dielectric layer, and
wherein the pillar pattern includes a seed pattern and a conductive pattern, the seed pattern being in contact with a top surface of the passivation layer and a top surface of the organic dielectric layer, the conductive pattern being spaced apart from the passivation layer and the organic dielectric layer.

2. The semiconductor device of claim 1, wherein the bump structure further includes a solder pattern on the pillar pattern.

3. The semiconductor device of claim 1, wherein the pillar pattern contacts the conductive pad and extends onto the top surface of the organic dielectric layer.

4. The semiconductor device of claim 1, wherein
a width of the pillar pattern is greater than a width of the second opening, and
the width of the second opening is greater than a width of the first opening.

5. The semiconductor device of claim 4, wherein
the width of the pillar pattern is equal to or greater than about 20 µm and equal to or less than about 70 µm,
the width of the second opening is equal to or greater than about 10 µm and less than about 20 µm, and
the width of the first opening is equal to or greater than about 5 µm and less than about 10 µm.

6. The semiconductor device of claim 1, wherein a top surface of the pillar pattern is flat.

7. The semiconductor device of claim 1, wherein the conductive pattern is a pattern formed by an electroplating process with the seed pattern as an electrode.

8. The semiconductor device of claim 7, wherein the conductive pattern includes conductive layers comprising:
a first conductive layer on the seed pattern;
a second conductive layer on the first conductive layer; and
a third conductive layer on the second conductive layer.

9. The semiconductor device of claim 8, wherein a top surface of the first conductive layer is at a level higher than a level of the top surface of the organic dielectric layer.

10. The semiconductor device of claim 8, wherein
the third conductive layer includes a material the same as a material of the first conductive layer, and
the second conductive layer includes a material different from the material of the first conductive layer and from the material of the third conductive layer.

11. The semiconductor device of claim 1, wherein the passivation layer includes a silicon-containing layer.

12. The semiconductor device of claim 1, wherein the passivation layer includes:
a first passivation layer; and
a second passivation layer on the first passivation layer and including a material different from a material of the first passivation layer,
wherein an inner wall of the second passivation layer is coplanar with an inner wall of the first passivation layer and is in contact with the pillar pattern.

13. A semiconductor device, comprising:
a semiconductor substrate;
a conductive pad on a first surface of the semiconductor substrate;
a silicon-containing layer on the first surface of the semiconductor substrate and exposing a portion of the conductive pad;
a polymer layer on the silicon-containing layer and exposing a portion of the silicon-containing layer and the portion of the conductive pad;
a pillar pattern on the conductive pad and in contact with the silicon-containing layer and the polymer layer; and
a solder pattern on the pillar pattern,
wherein the pillar pattern includes a seed pattern and a conductive pattern, the seed pattern being in contact with a top surface of the conductive pad, a top surface of the silicon-containing layer, and a top surface of the polymer layer.

14. The semiconductor device of claim 13, wherein
the polymer layer exposes a top surface of the silicon-containing layer.

15. The semiconductor device of claim 13, wherein the pillar pattern is in contact with an inner wall of the silicon-containing layer and an inner wall of the polymer layer,
wherein the inner wall of the polymer layer is not aligned with the inner wall of the silicon-containing layer.

16. The semiconductor device of claim 13, wherein the seed pattern is integrally formed as one body.

17. The semiconductor device of claim 13, wherein a contact area between the pillar pattern and the polymer layer is greater than a contact area between the pillar pattern and the silicon-containing layer.

18. The semiconductor device of claim 13, wherein
the silicon-containing layer includes silicon and nitrogen, and
the polymer layer includes photosensitive polyimide.

19. A semiconductor device, comprising:
a semiconductor substrate;
a circuit layer on the semiconductor substrate;
a conductive pad on the circuit layer;
a silicon-containing layer on the conductive pad, the silicon-containing layer having a first opening;
a polymer layer on the silicon-containing layer, the polymer layer having a second opening; and
a bump structure disposed on the conductive pad,
wherein the circuit layer includes:
an integrated circuit on a first surface of the semiconductor substrate;
a dielectric layer on the first surface of the semiconductor substrate, the dielectric layer covering the integrated circuit; and
an interconnection structure in the dielectric layer, the interconnection structure coupled to the integrated circuit, the interconnection structure including a wiring pattern and a via pattern,
wherein the first opening exposes a portion of the conductive pad and an inner wall of the silicon-containing layer,
wherein the second opening is spatially connected to the first opening and exposes a top surface of the silicon-containing layer, and
wherein the bump structure includes:
a pillar pattern in the first and second openings; and
a solder pattern on the pillar pattern,
wherein the pillar pattern includes:
a seed pattern in contact with the conductive pad, the exposed top surface of the silicon-containing layer, and an inner wall and a top surface of the polymer layer; and
a conductive pattern on the seed pattern.

20. The semiconductor device of claim 19, wherein the conductive pattern includes:
a first conductive part on the seed pattern, the first conductive part including a first metal;
a second conductive part on the first conductive part, the second conductive part including a second metal; and
a third conductive part on the second conductive part, the third conductive part including the first metal,
wherein the second metal is different from the first metal.

* * * * *